(12) United States Patent
Blake et al.

(10) Patent No.: US 8,598,021 B2
(45) Date of Patent: Dec. 3, 2013

(54) METHOD FOR JUNCTION AVOIDANCE ON EDGE OF WORKPIECES

(75) Inventors: Julian Blake, Gloucester, MA (US); Dale Stone, Lynnfield, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 139 days.

(21) Appl. No.: 13/248,056

(22) Filed: Sep. 29, 2011

(65) Prior Publication Data

US 2013/0084694 A1    Apr. 4, 2013

(51) Int. Cl.
*H01L 21/425* (2006.01)

(52) U.S. Cl.
USPC .................. 438/514; 438/527; 257/292

(58) Field of Classification Search
USPC ........... 438/513, 514, 527; 257/292, E21.334
See application file for complete search history.

(56) References Cited

U.S. PATENT DOCUMENTS

| | | | | |
|---|---|---|---|---|
| 4,287,259 A * | 9/1981 | Riley et al. | | 428/408 |
| 6,120,640 A | 9/2000 | Shih et al. | | |
| 2003/0081537 A1* | 5/2003 | Shinotsuka | | 369/275.4 |
| 2004/0262652 A1* | 12/2004 | Goushcha et al. | | 257/292 |
| 2008/0153275 A1* | 6/2008 | Rouh et al. | | 438/527 |
| 2010/0323508 A1* | 12/2010 | Adibi et al. | | 438/513 |
| 2011/0034013 A1* | 2/2011 | Hatem et al. | | 438/515 |
| 2011/0042578 A1* | 2/2011 | Murrell et al. | | 250/397 |
| 2011/0051222 A1* | 3/2011 | Park et al. | | 359/279 |

OTHER PUBLICATIONS

D.H. Neuhaus, Impact of Shunted Solar Cells on the IV Characteristics of Solar Modules, 21st European Photovoltaic Solar Energy Conference, Sep. 4-8, 2006, pp. 2556-2559, Dresden, Germany.

* cited by examiner

*Primary Examiner* — Phuc Dang

(57) ABSTRACT

A method of implanting ions into a workpiece without the formation of junctions, which impact the performance of the workpiece, is disclosed. To counteract the effect of dopant being implanted into the edge of the workpiece, components made of material having an opposite conductivity are placed near the workpiece. As ions from the beam strike these components, ions from the material are sputtered. These ions have the opposite conductivity as the implanted ions, and therefore inhibit the formation of junctions.

5 Claims, 3 Drawing Sheets

METHOD FOR JUNCTION AVOIDANCE ON EDGE OF WORKPIECES

BACKGROUND

Solar cells and other devices may be created through the use of ion implanters. These ion implanters are used to introduce dopants into portions of the workpiece to create an electrically conductive region.

FIG. 1 shows a block diagram of a conventional ion implanter 100. Of course, many different ion implanters may be used. The conventional ion implanter may comprise an ion source 102 that may be biased by a power supply 101. The system may be controlled by controller 120. The operator communicates with the controller 120 via user interface system 122. The ion source 102 is typically contained in a vacuum chamber known as a source housing (not shown). The ion implanter system 100 may also comprise a series of beam-line components through which ions 10 pass. The series of beam-line components may include, for example, extraction electrodes 104, a 90° magnet analyzer 106, a first deceleration (D1) stage 108, a 70° magnet collimator 110, and a second deceleration (D2) stage 112. Much like a series of optical lenses that manipulate a light beam, the beam-line components can manipulate and focus the ion beam 10 before steering it towards a workpiece or wafer 114, which is disposed on a workpiece support 116.

In operation, a workpiece handling robot (not shown) disposes the workpiece 114 on the workpiece support 116 that can be moved in one or more dimensions (e.g., translate, rotate, and tilt) by an apparatus, sometimes referred to as a "roplat" (not shown). Meanwhile, ions are generated in the ion source 102 and extracted by the extraction electrodes 104. The extracted ions 10 travel in a beam-like state along the beam-line components and implanted on the workpiece 114. After implanting ions is completed, the workpiece handling robot may remove the workpiece 114 from the workpiece support 116 and from the ion implanter 100.

During the ion implant process, the ions typically implant not only the desired face of the workpiece, but also the edges of the work piece 114. The implanted ions at the edge of the workpiece 114 may form a junction, upon activation of the implant. This edge junction may be undesirable, and may cause yield issues, such as shunting of solar cells.

This formation of a junction along the edge of a workpiece 114 may be due to several phenomenons. One possible cause is imperfect ion beam collimation, which may cause the ion beam to diverge more than desired, causing ions to strike unintended areas. Another possible cause is back-sputtering of material from surfaces around and behind the workpiece 114. For example, the material sputtered may be conductive, such as aluminum and create a short circuit from the top surface of the workpiece 114 to the bottom surface. In other embodiments, a non-contaminating material, such as graphite, is used for the material near the workpiece. While graphite does not cause a shunt, it does not help in preventing junctions caused by divergent ion beams. Furthermore, this problem is exacerbated in the case of solar cells, where the workpiece, after being processed, is not cut or divided into smaller portions, as is routinely done with integrated circuits.

Therefore, it would be beneficial if there existed a system and method for implanting ions into a workpiece, and more particularly, a solar cell, without creating shunts along the edge of the workpiece.

SUMMARY

A method of implanting ions into a workpiece without the formation of junctions, which impact the performance of the workpiece, is disclosed. To counteract the effect of dopant being implanted into the edge of the workpiece, components made of material having an opposite conductivity are placed near the workpiece. As ions from the beam strike these components, ions from the material are sputtered. These ions have the opposite conductivity as the implanted ions, and therefore inhibit the formation of junctions.

BRIEF DESCIPTION OF THE DRAWINGS

For a better understanding of the present disclosure, reference is made to the accompanying drawings, in which like elements are referenced with like numerals, and in which.

DETAILED DESCRIPTION

As described above, when ions are implanted into a workpiece, ions may also be deposited in unintended and undesired portions, such as along the edge of a solar cell. This problem may be due to divergent or poorly focused ion beams or back-sputtering of material onto the workpiece. In some cases, this unintended implanting of ions may reduce the yield of the workpiece. In other embodiments, this implanting may render the workpiece unusable.

It should be noted that this is a problem particularly for those workpieces which are not subsequently divided or separated into smaller components, as is typically done with integrated circuits. In those embodiments, any junctions that are created along the edge are eliminated during post processing. Thus, it is most problematic in applications where the workpiece is not cut after implant, such that the junctions along the edge remain intact. Thus, it is essential to eliminate these junctions in solar cell applications.

As described above, there are several causes of this junction, including unintended ion implantation and back-sputtering. The unintended ion implantation may be caused by beam divergence or poor focus. In other embodiments, it may be caused by the ions reflecting off another surface in the process chamber and implanting in the workpiece 114.

Knowing that back-sputtering causes material to be implanted in the workpiece, and particularly in the edge of the workpiece, it is possible to use back-sputtering to counteract the effects of unintended implant. In other words, one of the two causes of shunting in a workpiece (i.e. back-sputtering) is used to compensate for the second cause (i.e. unintended implantation of dopant along the edge).

Figure 1:
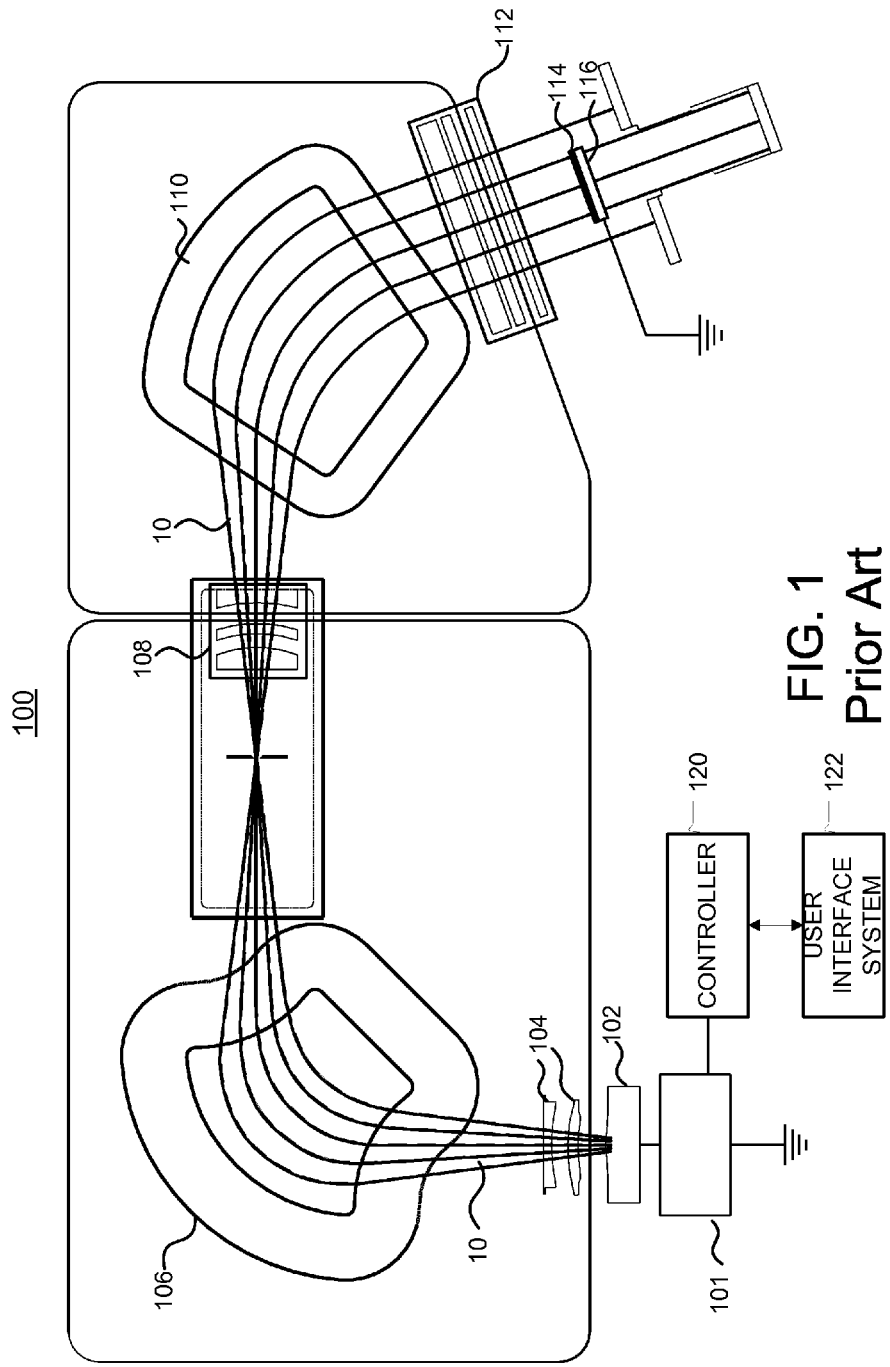
FIG. 1 is a block diagram of an ion implanter of the prior art.
Figure 2:
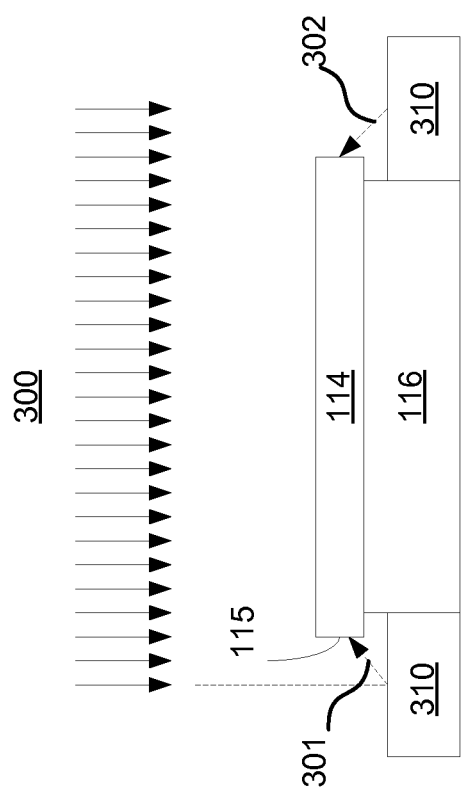
FIG. 2 shows different sources of ions being implanted into edge of workpiece.

One method to eliminate this unintended junction is to have the material that is back-sputtered counteract the material being implanted, as illustrated in FIG. 2. In other words, assume that an ion beam 300 comprising an n-type dopant, such as phosphorus, is being implanted into the workpiece 114. As described above, some of the phosphorus ions 301 will be inadvertently implanted along the edge 115 of the workpiece 114, thereby forming a junction. These phosphorus ions 301 may reflect off the cladding 310, which surrounds the workpiece support 116. In addition, ions 302, which is back-sputtered material from the cladding 310 also gets implanted into the edge 115 of the workpiece 114. If these ions 302 were a p-type dopant, such as boron, this would serve to counterdope the edge 115 of the workpiece 114, thus preventing the formation of a junction. Similarly, if a p-type dopant were being implanted, having n-type material back-sputtered would be beneficial.

In other words, the material that is back-sputtered should preferably be of a conductivity opposite that of the implanted species. Back-sputtering is the release of ions from a component as a result of being hit by energetic ions, such as from an ion beam. Thus, the components that are struck by the ion beam may be the source of the back-sputter. These components may include the workpiece support 116, the cladding 310 of the workpiece support 116, which may be a collar placed around or near the platen, or other beam-struck components.

Therefore, if an n-type dopant, such as a Group V element like phosphorus is to be implanted, it would be advantageously to have the cladding 310 and other beam-struck components be manufactured with a Group III element, such as boron, aluminum, or gallium. Conversely, if a p-type dopant, such as a Group III element like boron is to be implanted, it would be advantageous to have these components be manufactured with a Group V element, such as phosphorus or arsenic.

Furthermore, to maximize flexibility, it may be advantageous that these components be insertable and removable from the ion implanter. In other words, when an ion implant is done with boron, components manufactured with a Group V element are introduced to the chamber and placed where they may be struck by the ion beam. For example, a cladding 310 made with phosphorus, may be inserted around the workpiece support 116. Similarly, when an ion implant is done with phosphorus, components manufactured with a Group III element are introduced to the chamber and placed where they may be struck by the ion beam.

In some embodiments, the material used to manufacture these components, such as cladding 310, may be one such that ions will readily sputter from that material. In some embodiments, the materials used may include compounds including a Group III element, such as boron nitride (BN), boron trioxide ($B_2O_3$), and aluminum oxide ($Al_2O_3$). In some embodiments, the material may be a Group III element, such as aluminum (Al), indium (In) and gallium (Ga). In other embodiments, the material may be a Group V element, such as arsenic, phosphorus and antimony. In other embodiments, the material may be a compound including a Group V element. In other embodiments, the material may be doped with Group III or Group V elements. In some embodiments, conductors are preferable to insulators. In some embodiments, aluminum alloys may be undesirable due to the potential metallic contaminants they contain, such as copper and magnesium.

Figure 3:
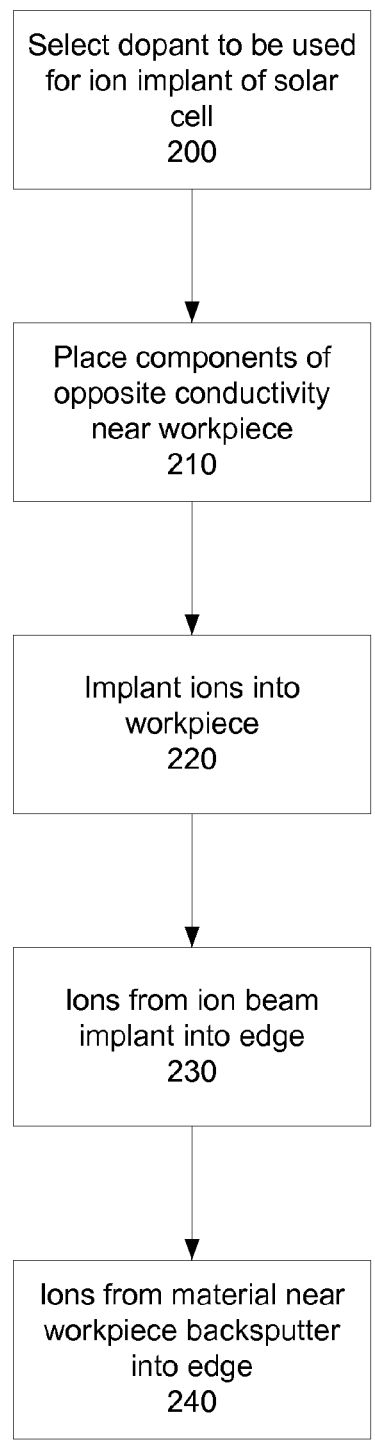
FIG. 3 illustrates a flowchart according to one embodiment.

Thus, to reduce junctions created along the edge of an implanted workpiece, where these junctions may adversely affect the performance or yield of the workpiece, the following method, shown in FIG. 3, may be used.

The type of ions to be implanted is selected, as shown in step 200. As described above, these ions may be p-type (such as boron) or n-type (such as phosphorus). Components, such as the cladding 310 of the workpiece support, or other components likely to be struck by the ion beam, are then placed near the workpiece, as shown in step 210. These components are made with a material having the opposite conductivity as the ions of the ion beam. The workpiece is then implanted by the ion beam, as shown in step 220. Reflected ions from the ion beam become implanted along the edge of the workpiece, as shown in step 230. Material from the components placed near the workpiece is back-sputtered onto the edge of the workpiece, as shown in step 240. The implanting of both ions from the beam and back-sputtered material of the opposite conductivity inhibit the formation of a junction along the edge. Finally, the workpiece is removed and further processed, where that further processing may not include cutting, separating or removing the edge of the workpiece.

In other embodiments, only one particular type of dopant (either p-type or n-type) is implanted into the workpiece 114. In this embodiment, the components described above may be permanently affixed to the chamber near the workpiece, and do not need to be removable.

In other embodiments, only those implants that are blanket implants, as opposed to patterned implants that utilize a shadow mask, result in the formation of junctions along the edge of the workpiece. In this embodiment, the components located near the workpiece may be constructed of a material having the opposite conductivity of the dopant used in the blanket implant.

For example, the processing of a solar cell may include a blanket implant of one dopant over the entire surface of the workpiece 116. Since there is no mask used in this case, the amount of ions and sputtering is maximized. Therefore, the cladding 310 should be of a material of opposite conductivity of this dopant. If a second patterned implant is performed, a shadow mask is used. This shadow mask, in addition to covering portions of the workpiece, may also serve to limit back-sputtering and the implanting of ions along the edge 115 of the workpiece 116. Thus, the type of cladding 310 used during a patterned implant may be less critical.

The disclosure describes the material used for the cladding as being of a material having a conductivity opposite that of the dopant use. This does not limit the material to only those pure compounds having that material. For example, if an n-type dopant is used, the cladding 310 is preferably constructed of a material contain boron, or a molecular compound containing boron, such as boron nitride.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of implanting ions into a workpiece while minimizing the formation of junctions along an edge of said workpiece, comprising:

selecting a dopant of a first conductivity to be used in an ion beam to implant into said workpiece;

placing a component made of a material having a conductivity opposite said first conductivity near said workpiece; and directing said ion beam toward said workpiece, thereby implanting said dopant into said workpiece, wherein some of said dopant is implanted into said edge of said workpiece, and wherein said ion beam strikes said component, such that said material is back-sputtered into said edge, thereby counteracting an effect of said dopant implanted into said edge.

2. The method of claim 1, wherein said component comprises a cladding disposed around a workpiece support used to hold said workpiece.

3. The method of claim 1, wherein said dopant comprises a Group V element, and said material comprises boron or a boron based compound.

4. The method of claim 1, further comprising processing said workpiece after said implanting step, where said processing does not include removing or cutting said edge.

5. The method of claim 1, wherein said workpiece is processed to form a solar cell.

* * * * *